(12) United States Patent
Lin (10) Patent No.: US 6,756,821 B2
(45) Date of Patent: Jun. 29, 2004

(54) HIGH SPEED DIFFERENTIAL SIGNALING LOGIC GATE AND APPLICATIONS THEREOF

(75) Inventor: Tsung-Hsien Lin, Los Angeles, CA (US)

(73) Assignee: Broadcom, Irvine, CA (US)

( * ) Notice: Subject to any disclaimer, the term of this patent is extended or adjusted under 35 U.S.C. 154(b) by 7 days.

(21) Appl. No.: 10/201,108

(22) Filed: Jul. 23, 2002

(65) Prior Publication Data

US 2004/0017223 A1 Jan. 29, 2004

(51) Int. Cl.[7] ............................. H03K 19/20; H03L 7/06
(52) U.S. Cl. ..................... 326/115; 326/119; 327/156
(58) Field of Search ................... 326/104, 114, 326/115, 119, 120; 327/156–157, 147–148

(56) References Cited

U.S. PATENT DOCUMENTS

| | | | | |
|---|---|---|---|---|
| 5,291,076 A | * | 3/1994 | Bridges et al. | ............... 326/52 |
| 6,265,898 B1 | * | 7/2001 | Bellaouar | ................... 326/93 |
| 6,333,645 B1 | * | 12/2001 | Kanetani et al. | .............. 326/98 |

FOREIGN PATENT DOCUMENTS

JP 62021324 A * 1/1987 ......... H03K/19/086

* cited by examiner

Primary Examiner—James H. Cho
(74) Attorney, Agent, or Firm—Timothy W. Markison (57) ABSTRACT

A high-speed differential signaling logic gate includes a $1^{st}$ input transistor, $2^{nd}$ input transistor, complimentary transistor, complimentary transistor, current cource, a $1^{st}$ load, and a $2^{nd}$ load. The $1^{st}$ input transistor is operably coupled to receive a $1^{st}$ input logic signal, which may be one phase of a first differential input signal. The $2^{nd}$ input transistor is coupled in parallel with the $1^{st}$ input transistor and is further coupled to receive a $2^{nd}$ input logic signal, which may be one phase of a $2^{nd}$ differential input signal. The complimentary transistor is operably coupled to the sources of the $1^{st}$ and $2^{nd}$ input transistors and to receive a complimentary input signal, which mimics the other phase of the $1^{st}$ differential logic signal and the $2^{nd}$ differential logic signal. The current source sinks a fixed current from the $1^{st}$ and $2^{nd}$ input transistors and the complimentary transistor. The $1^{st}$ load is operably coupled to the drains of the $1^{st}$ and $2^{nd}$ input transistors to provide a $1^{st}$ phase of a differential logic output. The $2^{nd}$ load is coupled to the drain of the complimentary transistor to provide a $2^{nd}$ phase of the differential logic output.

26 Claims, 7 Drawing Sheets logic gate 180

FIG. 3 local oscillation module 74

FIG. 4
divider module 108

FIG. 5
NOR gate 156

FIG. 7
logic gate 180

FIG. 6
logic gate 170

| logic table | NOR | | OR | |
|---|---|---|---|---|
| inputs | C | D | D | C |
| a  b | | | | |
| 0  0 | 1 | 0 | 0 | 1 |
| 1  0 | 0 | 0 | 1 | 1 |
| 0  1 | 0 | 1 | 1 | 0 |
| 1  1 | 0 | 1 | 1 | 0 |

| logic table | NAND | | AND | |
|---|---|---|---|---|
| inputs | D | C | C | D |
| a  b | | | | |
| 0  0 | 0 | 1 | 0 | 1 |
| 1  0 | 1 | 1 | 0 | 0 |
| 0  1 | 1 | 0 | 1 | 0 |
| 1  1 | 1 | 0 | 1 | 0 |

FIG. 8
logic gate 190

FIG. 9
logic gate 200

US 6,756,821 B2

HIGH SPEED DIFFERENTIAL SIGNALING LOGIC GATE AND APPLICATIONS THEREOF

BACKGROUND OF THE INVENTION

1. Technical Field of the Invention

This invention relates generally to signal processing and more particularly to logic gates.

2. Description of Related Art

Digital logic circuits such as AND gates, NAND gates, NOR gates, OR gates, exclusive OR gates, latches, inverters, flip-flops, et cetera are known to be used in a wide variety of electronic devices. For instance, digital logic circuits are used in all types of computers (e.g., laptops, personal computers, personal digital assistants, et cetera), entertainment equipment (e.g., receivers, televisions, et cetera), and wireless communication devices (e.g., cellular telephones, radios, wireless local area network devices, et cetera).

Typically, digital logic circuits are part of a larger circuit, which is fabricated on an integrated circuit. For example, a local oscillator within a radio frequency (RF) transmitter and/or receiver includes a plurality of flip-flops and logic gates in its divider feedback circuit to provide adjustable divider values. As is known, by adjusting the divider value in a local oscillator, the resulting local oscillation can be adjusted to desired values.

Within the feedback divider circuit, the logic gates are included to achieve divider values different than powers of 2. Issues arise with the use of traditional logic gates in applications that push the operating limits of an integrated circuit process. For example, for a multi-gigahertz frequency range of operation, traditional logic gates create a bottleneck for the local oscillator due to the time it takes for each logic gate to complete its function.

Another related issue results as supply voltages decrease for newer integrated circuit fabrication processes (e.g., CMOS, gallium arsenide, silicon germanium, et cetera). As the supply voltage decreases, the available voltage to enable stacked transistors within the logic gates decreases. As such, the transistors have slower rise and fall times than if more voltage were available. Accordingly, it takes longer for the logic gate to complete its function due to the slower rise and fall times.

One obvious solution for increasing the rise and fall times of logic gates is to increase the supply voltage. However, by increasing the supply voltage, power consumption increases, arid, in many ways, defeats the benefit of newer integrated circuit fabrication processes.

Further, in high performance applications, such as a radio frequency integrated circuit, differential signaling is used to improve noise immunity. Accordingly, the logic gates within the divider circuit of the local oscillator are differential circuits. As is known, an AND function and an OR function are achieved by the same combination of stack transistors by switching the plurality of the inputs, The number of transistors in each stack is dependent on the number of inputs. For example, a 2 input AND gate or OR gate function has 2 sets of 2 transistor stacked on a current source, a 3 input AND gate or OR gate function has 2 sets of 3 transistor stacks, et cetera. As such, differential logic gates suffer from the above-mentioned issues as well.

Therefore, a need exists for a high-speed differential logic gate that operates effectively in the multi-gigahertz range and is power consumption efficient.

BRIEF SUMMARY OF THE INVENTION

The high-speed differential signaling logic gate of the present invention substantially meets these needs and others. In one embodiment of a high speed differential signaling logic gate, it includes a $1^{st}$ input transistor, $2^{nd}$ input transistor, complimentary transistor, current source, a $1^{st}$ load, and a $2^{nd}$ load. The $1^{st}$ input transistor is operably coupled to receive a $1^{st}$ input logic signal, which may be one phase of a first differential input signal. The $2^{nd}$ input transistor is coupled in parallel with the $1^{st}$ input transistor and is further coupled to receive a $2^{nd}$ input logic signal, which may be one phase of a $2^{nd}$ differential input signal. The complimentary transistor is operably coupled to the sources of the $1^{st}$ and $2^{nd}$ input transistors and to receive a complimentary input signal. The complimentary input signal mimics the other phase of the $1^{st}$ differential logic signal and the $2^{nd}$ differential logic signal.

The current source is coupled to sink a fixed current from the $1^{st}$ and $2^{nd}$ input transistors as well as from the complimentary transistor. The $1^{st}$ load is operably coupled to the drains of the $1^{st}$ and $2^{nd}$ input transistors and to a $2^{nd}$ potential. The coupling between the $1^{st}$ load and the drains of the $1^{st}$ and $2^{nd}$ input transistors provides a $1^{st}$ leg, or phase, of a differential logic output. The $2^{nd}$ load is coupled to the drain of the complimentary transistor and to the $2^{nd}$ potential (e.g., $V_{DD}$). The coupling between the $2^{nd}$ load and the drain of the complimentary transistor provides a $2^{nd}$ leg, or phase, of the differential logic output.

The high speed differential signaling logic gate may be configured to implement a NOR function, OR function, NAND function, or AND function based on the differing configurations of utilizing the phases of the $1^{st}$ and $2^{nd}$ differential input signals as well as the different phases for the differential output. For example, a NOR function may be obtained when the positive leg of the differential input signal is coupled to the $1^{st}$ input transistor and the positive leg of the $2^{nd}$ differential input signal is coupled to the $2^{nd}$ input transistor. The $1^{st}$ leg of the differential logic output is the positive leg of a differential NOR output and the $2^{nd}$ leg of the differential logic output is a negative leg of the differential NOR output.

Another embodiment of a high speed differential signaling combinational logic circuit includes a $1^{st}$ input transistor, a $2^{nd}$ input transistor, a complimentary transistor, a $3^{rd}$ input transistor, a $4^{th}$ input transistor, a current source, a $1^{st}$ load, and a $2^{nd}$ load. The $1^{st}$ and $2^{nd}$ input transistors are operably coupled to receive one phase of $1^{st}$ and $2^{nd}$ differential input signals. The complimentary transistor is operably coupled to receive a complimentary input signal. The $3^{rd}$ and $4^{th}$ input transistors are operably coupled to receive one phase of a $3^{rd}$ differential input logic signal. The $1^{st}$ load is coupled to the drains of the $1^{st}$ and $2^{nd}$ input transistors wherein such coupling provides a $1^{st}$ leg of a differential logic output. The $2^{nd}$ load is coupled to the drain of the complimentary transistor wherein such coupling provides a $2^{nd}$ leg of the differential logic output. The drain of the $4^{th}$ input transistor is coupled to the drain of the complimentary transistor. The drain of the $3^{rd}$ input transistor is coupled to the sources of the $1^{st}$, $2^{nd}$ and complimentary transistors.

By utilizing different phases of the differential input signals and changing phases of the differential output signal multiple combination or logic functions may be achieved. For instance, a OR/NAND function, an OR/AND function, a NAND/AND function and an AND function may be obtained through various combinations of the phases of the differential input signals and changing phases of the differential output signal.

Various embodiments of the high-speed differential signaling logic gate or combinational logic circuit may be used in a divider circuit of a local oscillator within a radio frequency integrated circuit. Other applications from the high-speed differential signaling logic gate, and/or combination of logic circuit, may be used in computers, home entertainment equipment, et cetera.

DETAILED DESCRIPTION OF THE INVENTION

Figure 1:
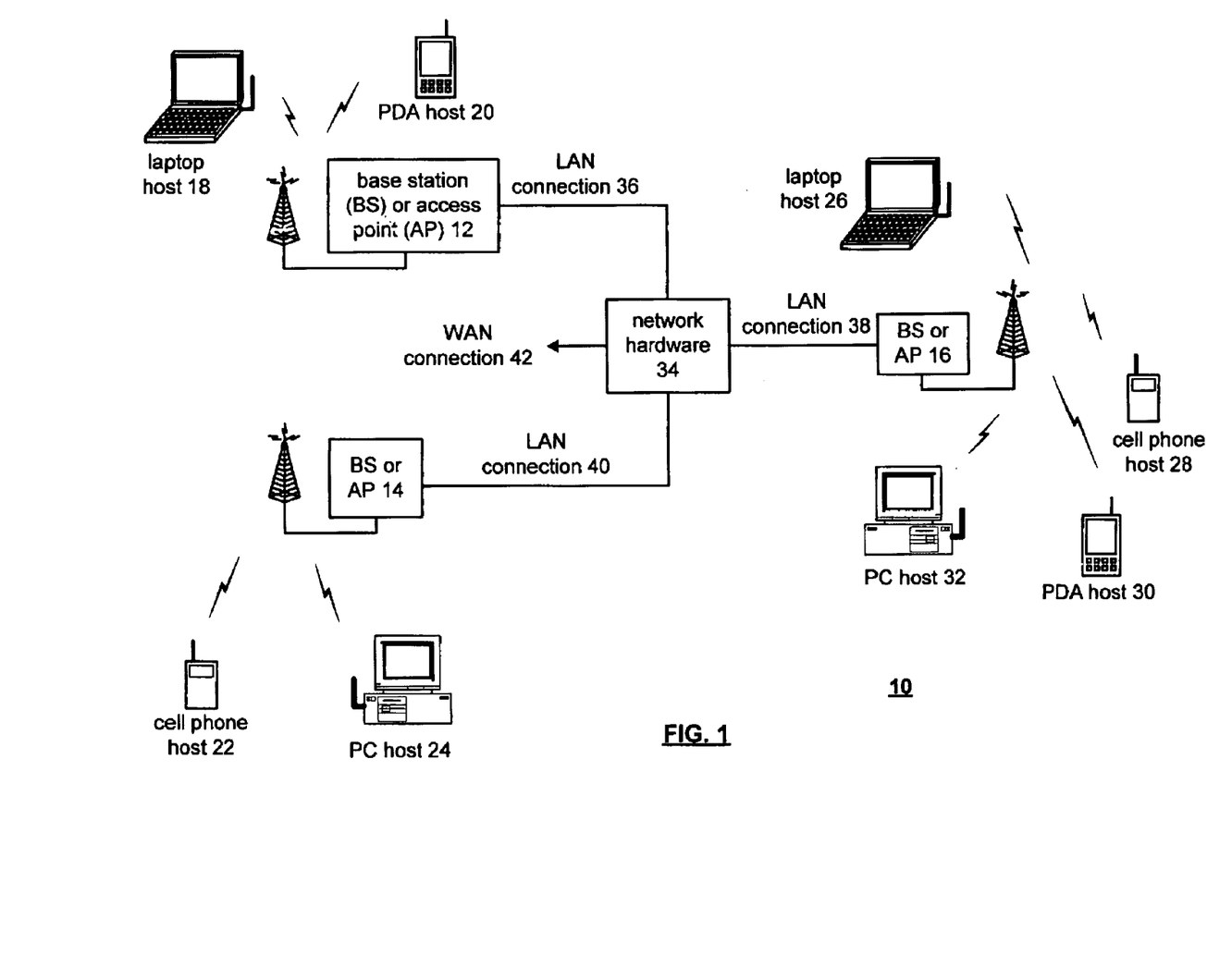
FIG. 1 is a schematic block diagram illustrating a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
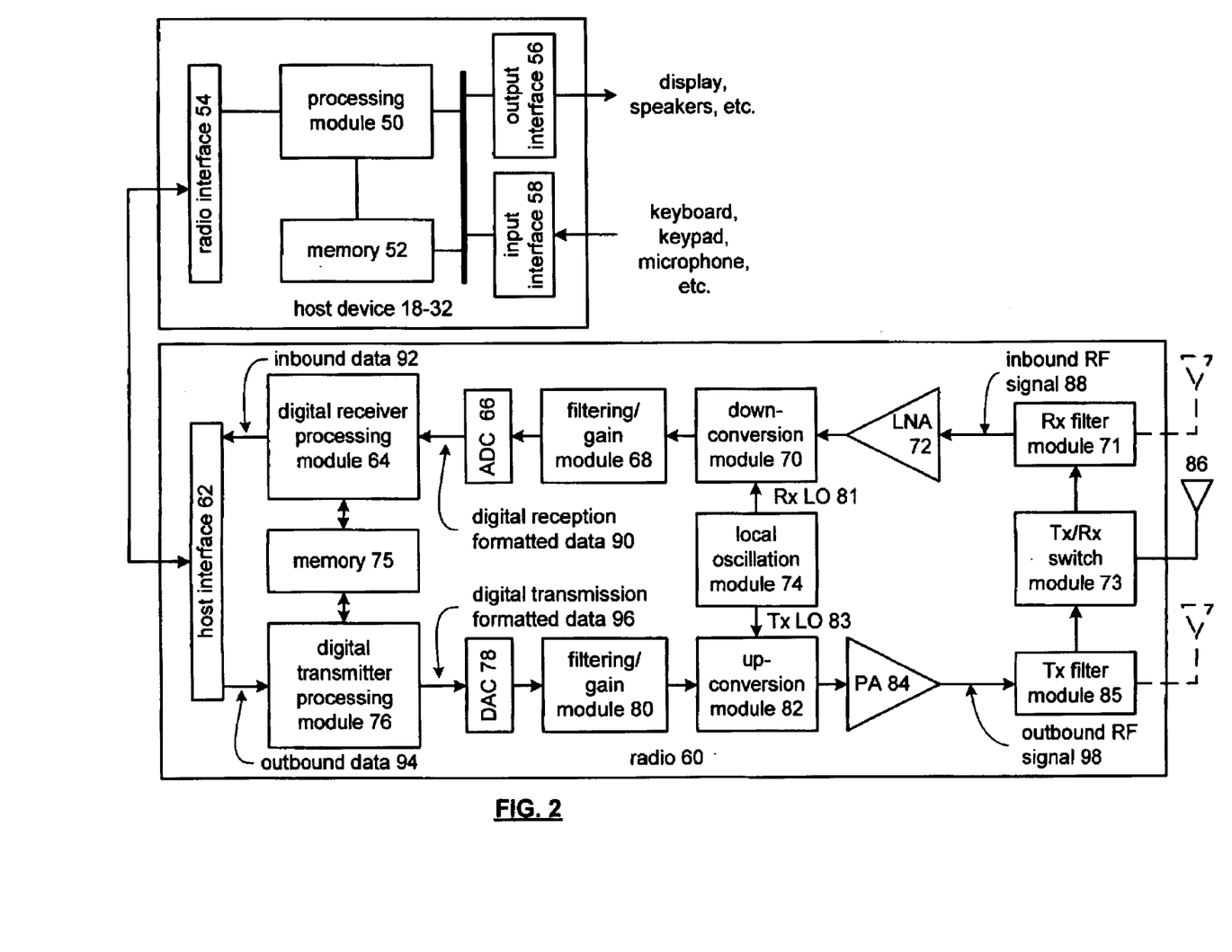
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power Amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
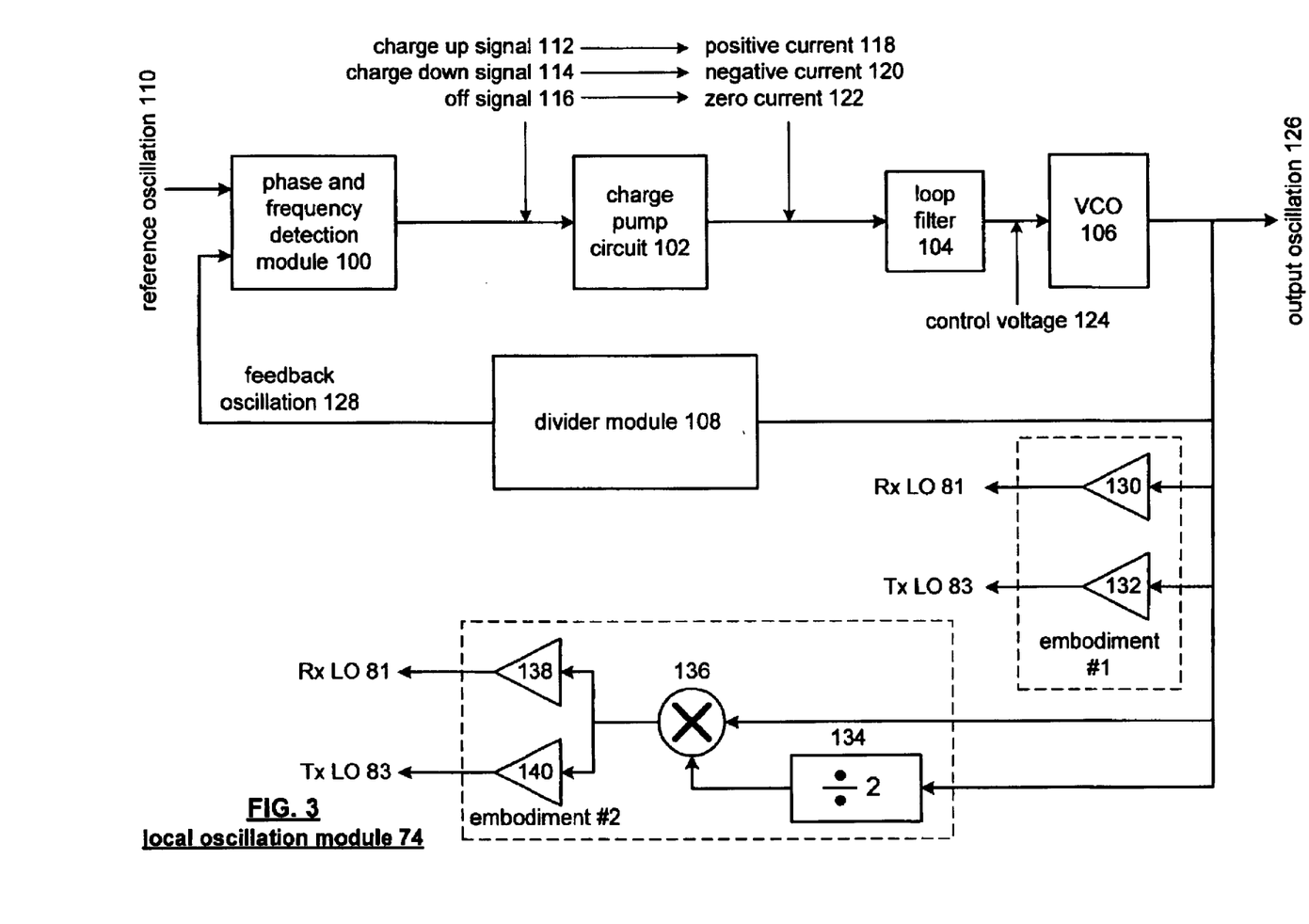
FIG. 3 is a schematic block diagram of a local oscillation module that may be used in the wireless communication device of FIG. 2.

FIG. 3 illustrates an embodiment of the local oscillation module 74 that includes a phase and frequency detection module 100, a charge pump circuit 102, a loop filter 104, a voltage controlled oscillator (VCO) 106, and a divider module 108. The receiver local oscillation 81 and the transmitter local oscillation 83 may be generated from the output oscillation 126 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increased oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. A crystal oscillator and/or any other type of clock source may produce the reference oscillation 110. The phase and frequency detection module 100 produces a charge-up signal 112 when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal 114 when the phase and/or frequency of the feedback oscillation 128 leads the phase and/or frequency of the reference oscillation 110. In this condition, the output oscillation 126 is above its desired rate. The phase and frequency detection module 100 produces the off signal 116 when the phase and/or frequency of the feedback oscillation 128 is aligned with the phase and/or frequency of the reference oscillation 110 and when the charge up signal 112 and charge down signal 114 are not being produced.

The charge pump circuit 102 receives the charge-up signal 112, the charge-down signal 114 and the off signal 116. The charge pump 102 produces a positive current 118 in response to the charge-up signal 112; produces a negative current 120 in response to the charge-down signal 114; and produces a zero current 122 in response to the off signal 116. The loop filter 104 receives the positive current 118, negative current 120 and the zero current 122 and produces therefrom a control voltage 124. The loop filter 104 provides the control voltage 124 to the voltage control oscillator 106, which generates the output oscillation 126 based thereon.

The divider module 108, which may be a fractional-N divider module, divides the output oscillation 126 by a divider value (e.g., an integer value or a real number) to produce the feedback oscillation 128. The divider module 108 will be described in greater detail with reference to FIG. 4. Note that if the divider module 108 is a fractional-N divider module it includes a Delta Sigma modulator, register and summing module. The Delta Sigma modulator is operably coupled to generate an over sampled digital data stream that represents a fractional component of the fractional-N divider value. The register stores an integer component of the fractional-N divider value while the summing module sums the over sampled digital data stream with the integer component to produce the fractional-N divider value.

Figures 4, 5:
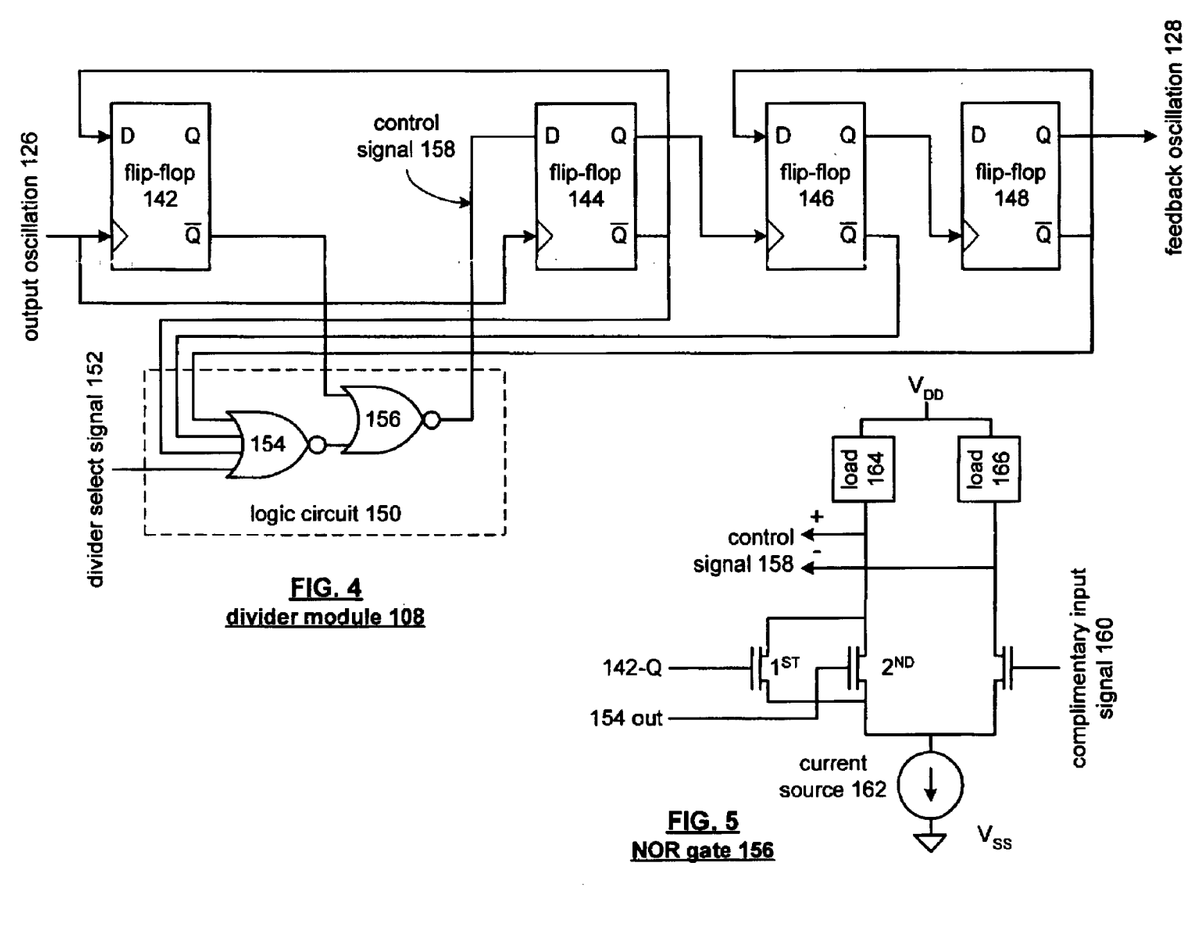
FIG. 4 is a schematic block diagram of a divider module that may be used in the local oscillation module of FIG. 3.
FIG. 5 is a schematic block diagram of a high speed differential signaling logic gate configured as a NOR gate in accordance with the present invention.

FIG. 4 illustrates a schematic block diagram of divider module 108. The divider module 108 includes a plurality of flipflops 142–148 and logic circuitry 150, which may process differential signals or single-ended signals. The logic circuit 150 includes NOR gate 154 and NOR gate 156. The logic circuitry 150 produces a control signal 158 based on the outputs of the flipflops 142, 144, 146 and 148 as well as a divider select signal 152. In accordance with the control signal 158, the divider module 108 will provide a divide by 15 function or divide by 16 function. Accordingly, the feedback oscillation 128 will be $1/15^{th}$ or $1/16^{th}$ the output oscillation 126.

FIG. 5 is a schematic block diagram of a high speed differential signaling logic gate configured as a NOR gate 156. The NOR gate 156 includes a $1^{st}$ input transistor, a $2^{nd}$ input transistor, a complimentary transistor (COMP), a current source 162 and a pair of loads 164 and 166, which may be resistors, transistors, or any other circuit element that provides an impedance. The gate of the complimentary transistor is operably coupled to receive a complimentary input signal 160. The complimentary input signal 160 mimics the opposite phase of the inputs provided to the $1^{st}$ and/or $2^{nd}$ input transistors. The generation of the complimentary input signal 160 will be described in greater detail with reference to FIGS. 6 and 7.

The $1^{st}$ and $2^{nd}$ input transistors are operably coupled to receive separate input signals. To implement the NOR gate 156 of the logic circuitry 150, the $1^{st}$ input transistor has its gate coupled to receive the positive phase, or leg, of the differential output of flip-flop 142. The gate of the $2^{nd}$ input transistor is operably coupled to receive one phase, or leg, of the differential output of NOR gate 154. Accordingly, when at least one of the inputs provided to the $1^{st}$ and $2^{nd}$ transistor is high (e.g., a logic one state), the majority of the current sinked by current source 162 flows through the $1^{st}$ or $2^{nd}$ input transistor. As such, the node coupling load 164 to the $1^{st}$ and $2^{nd}$ input transistors is low (e.g., logic zero). The node coupling load 166 to the drain of the complimentary transistor is high since the complimentary transistor is essentially off. Thus, a differential output signal, which in this example is control signal 158, is produced at the nodes coupling the loads 164 and 166 to their respective transistors.

As one of average skill in the art will appreciate, NOR gate 154 may be implemented in a similar fashion as NOR gate 156 of FIG. 5 with the addition of two input transistors coupled in parallel with the $1^{st}$ and $2^{nd}$ input transistors wherein the gates of the additional input transistors are operably coupled to receive respective inputs of the four input NOR gate 154.

Figure 6:
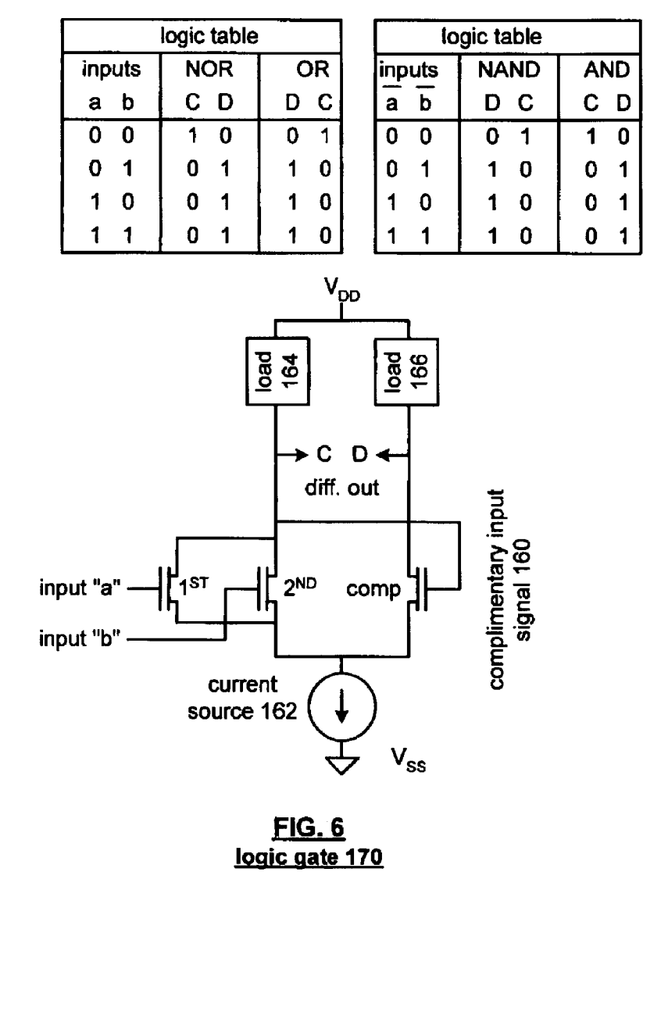
FIG. 6 is a schematic block diagram of an embodiment of a high speed differential signaling logic gate in accordance with the present invention.

FIG. 6 illustrates a schematic block diagram of a high speed differential signaling logic gate 170 that may be configured to implement a NOR gate, OR gate, NAND gate or AND gate. As shown, the logic gate 170 includes $1^{st}$ and $2^{nd}$ input transistors, the complimentary input transistor, current source 162 and loads 164 and 166. In this implementation, the complimentary input signal 160 is provided by the drain of the $1^{st}$ and $2^{nd}$ input transistors. As such, when the $1^{st}$ or $2^{nd}$ input is on, the complimentary input signal is low, thus the complimentary transistor is off, and the differential output has its $1^{st}$ leg "C" low and its $2^{nd}$ leg "D" high. Conversely, when the both the $1^{st}$ and $2^{nd}$ input transistors are off, the complimentary input signal will be high, thus the complimentary transistor will be on, and the differential output will haves its $1^{st}$ leg "C" high and its $2^{nd}$ leg "D" low.

As is further shown, the $1^{st}$ input transistor is operably coupled to receive one phase of differential input "a" and the $2^{nd}$ input transistor is operably coupled to receive one phase of differential input "b". Accordingly, by modifying the polarity of the inputs and the polarity of the differential output, the NOR function, OR function, NAND function or AND function may be achieved via the logic gate 170.

For example, to achieve a NOR function, the positive phases of differential input "a" and differential input "b" are received by the $1^{st}$ and $2^{nd}$ input transistors, respectively. The differential output of a NOR function has node C being the positive leg and node D being the negative leg. To achieve an OR function, the positive legs of the differential inputs "a" and "b" are inputted to the $1^{st}$ and $2^{nd}$ input transistors. The differential output of an OR function has node C being the negative leg and node D being the positive leg.

To achieve a NAND function, the negative legs of the differential inputs "a" and "b" are provided to the $1^{st}$ and $2^{nd}$ input transistors, respectively. The differential output of a NAND function has the C node being the negative leg and the D node being the positive leg. To achieve an AND function, the negative phases of the differential inputs "a" and "b" are inputted to the $1^{st}$ and $2^{nd}$ input transistors, respectively. The differential output of an AND function has node C as the positive phase and node D as the negative phase.

As illustrated, the logic gate 170 is coupled to a $1^{st}$ and $2^{nd}$ potential, where the $1^{st}$ potential corresponds to $V_{SS}$ (e.g., circuit ground or analog ground), and $V_{DD}$, which corresponds to the supply voltage. As such, the logic gate 170 may be used in a wide variety of differential circuit implementations especially multi-gigahertz frequency operations and low supply voltage operations since the logic gate does not include stacked transistors on a current source and thus has sufficient rise and fall times to meet the demands of multi-gigahertz operation without excessive power consumption.

Figure 7:
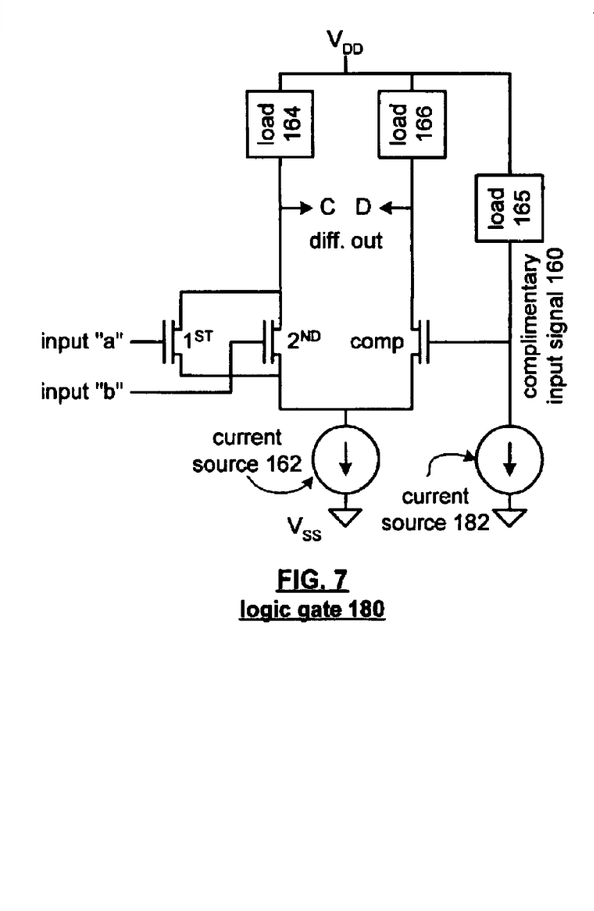
FIG. 7 is a schematic block diagram of an alternate embodiment of a high speed differential signaling logic gate in accordance with the present invention.

FIG. 7 illustrates an alternate embodiment of a high speed differential signaling logic gate 180. In this implementation, the loads 164 or 166, current source 162, 1$^{st}$ and 2$^{nd}$ input transistors and complimentary transistor function as previously described with reference to FIG. 6. In this embodiment, however, the complimentary input signal 160 is produced via a load 165 and a 2$^{nd}$ current source 182. The load 165, which may be a resistor, has the same impedance value as loads 164 and 166. The current source 182 sinks approximately one-half the current as current source 162, which allows the complimentary transistor to turn on when both the input transistors are off and to turn off when one or both of the input transistors are on. For example, when the 1$^{st}$ and/or the 2$^{nd}$ input transistors are on (i.e., its input is high at $V_{DD}$) and the gate voltage of the complimentary transistor is at $V_{DD}$ minus the voltage drop across load 165, the current provided by current source 162 flows primarily through load 164 and not through load 166. As such, the complimentary transistor is effectively off and one or both the input transistors are on such that node C of the differential output will be low and node D of the differential output will be high. Conversely, when both input transistors are off (i.e., both input signals are low), the biasing of the complimentary transistor will essentially turn on the complimentary transistor such that the current sinked by current source 162 will flow through load 166. In this state, node D of the differential output will be low and node C of the differential output will be high.

As one of average skill in the art will appreciate, the logic gate 180 of FIG. 7 may be configured to produce a NOR function, OR function, NAND function or AND function in a similar manner as logic gate 170 of FIG. 6. As one of average skill in the art will further appreciate, the logic gate 170 of FIG. 6 and logic gate 180 of FIG. 7 may be implemented using N-channel transistors or P-channel transistors with the circuit reconfigured accordingly.

Figure 8:
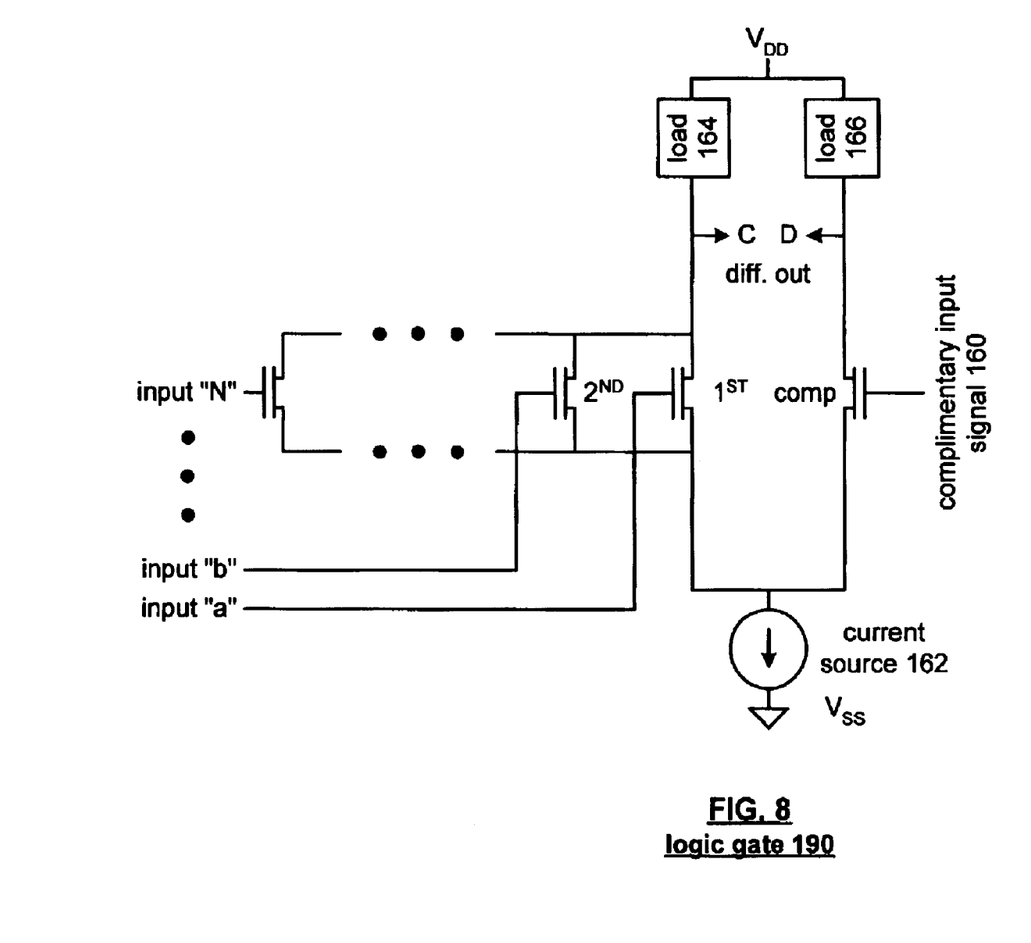
FIG. 8 is a schematic block diagram of another embodiment of a high speed differential signaling logic gate in accordance with the present invention.

FIG. 8 illustrates a schematic block diagram of a high speed differential signaling logic gate 190 that includes a plurality of input transistors, the complimentary transistor, the 1$^{st}$ and 2$^{nd}$ loads 164 and 166, and current source 162. The gate of the complimentary transistor is operably coupled to receive the complimentary input signal 160, which may be generated as illustrated in FIGS. 6 or 7. In this embodiment, the logic gate 190 includes a plurality of inputs and a corresponding number of input transistors. As such, three or more input logic functions, such as NOR, OR, AND and NAND, maybe achieved without stacking transistors.

Figure 9:
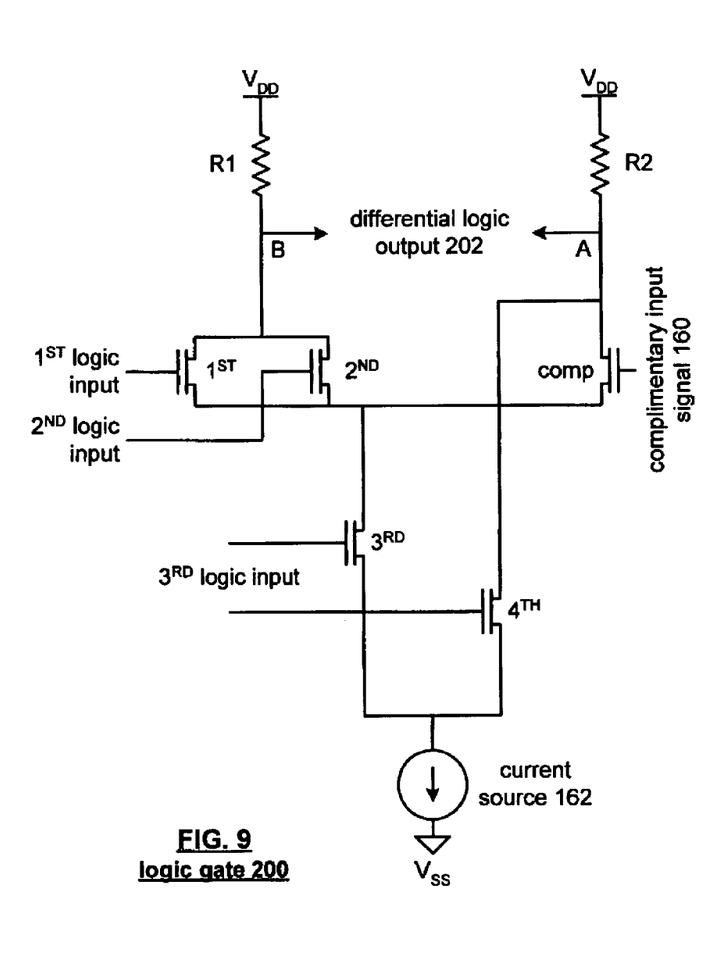
FIG. 9 is a schematic block diagram of a high speed differential signaling combination of logic gate or circuit in accordance with the present invention.

FIG. 9 illustrates a high speed differential signaling combinational logic circuit 200 that includes 4 input transistors, a complimentary transistor, two loads R1 and R2, and a current source 162. In this embodiment, the 1$^{st}$ and 2$^{nd}$ input transistors are operably coupled to receive one phase or another of respective differential logic input signals (e.g., 1$^{st}$ logic signal or 2$^{nd}$ logic signal). The 3$^{rd}$ and 4$^{th}$ input transistors are operably coupled to receive respective legs of a 3$^{rd}$ logic input signal. The complimentary transistor is coupled to receive the complimentary input signal 160, which may be generated as illustrated in FIGS. 6 or 7. As one of average skill in the art will appreciate, multiple input transistors may be coupled in parallel with the 1$^{st}$ and 2$^{nd}$ input transistors to further extend the functionality of the logic gate 200. The logic gate 200 may be configured to implement one or more of the logical functions illustrated in FIGS. 10–13.

Figure 10:
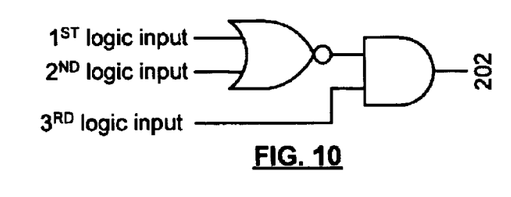
FIGS. 10–12 illustrate the logical operations of the logic gate of FIG. 9.

As shown in FIG. 10, the positive phases of the 1$^{st}$ and 2$^{nd}$ logic input signals are provided to perform a OR function. The output of the OR gate is coupled to one input of an AND gate. The 2$^{nd}$ input of the AND gate is coupled to the differential 3$^{rd}$ logic input signal. As such, the differential logic output 202 is achieved as a OR function of the 1$^{st}$ and 2$^{nd}$ logic input signals (the positive phases thereof) and an ANDing of the 3$^{rd}$ logic input with the resulting OR function. To achieve the OR function, node A of differential logic output 202 is considered to be the positive phase and node B is considered to be the negative phase.

Figure 11:
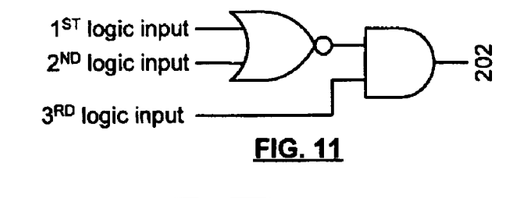

FIG. 11 illustrates an OR/NAND function. The configuration is similar to the NOR/AND function of FIG. 10, however, the polarity of the differential logic output 202 is reversed. As such, the node B is considered the positive phase and node A is the negative phase for the differential logic output of FIG. 11.

Figure 12:
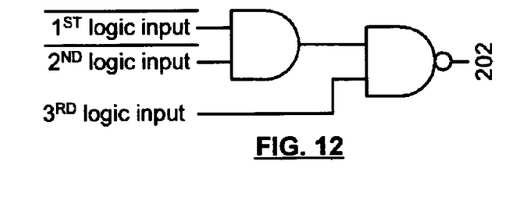

FIG. 12 illustrates a NAND/AND function where the negative phases of the 1$^{st}$ and 2$^{nd}$ logic inputs are provided to the 1$^{st}$ and 2$^{nd}$ transistors. Node A of differential logic output 202 is considered to be the positive phase and node B is considered to be the negative phase of the differential output 202 to produce the NAND function. The ANDing of the 3$^{rd}$ logic input with the output of the NAND gate produces the differential logic output 202.

The preceding discussion has presented a high speed differential signaling logic gate and combinational logic circuit that may be used separately or in multiple combinations to achieve an almost endless list of digital logical functions. The logic circuits and/or gates, include a minimal number of transistors which reduces power consumption, improves speed of performance, and allows such gates to be implemented in multi-gigahertz applications, such as radio frequency integrated circuits when fabricated within a CMOS integrated circuit. As one of average skill in the art will appreciate, other embodiments may be derived from the teachings of the present invention, without deviating from the scope of the claims.

What is claimed is:

1. A high-speed differential signaling logic gate comprises:

a first input transistor having a gate, a drain, and a source, wherein the gate of the first input transistor is operably coupled to receive a first input logic signal;

a second input transistor having a gate, a drain, and a source, wherein the gate of the second input transistor is operably coupled to receive a second input logic signal, wherein the first and second input transistors are coupled in parallel;

a complimentary transistor having a gate, a drain, and a source, wherein the source of the complimentary transistor is operably coupled to the sources of the first and second input transistors, wherein the gate of the complimentary transistor is operably coupled to receive a complimentary input signal;

a current source operably coupled to the sources of the first and second input transistors and to a first potential;

a first load operably coupled to the drains of the first and second input transistors and to a second potential, wherein the coupling of the first load to the drains of the first and second input transistors provides a first leg of a differential logic output of the high-speed differential signaling logic gate;

a second load operably coupled to the drain of the complimentary transistor and to the second potential, wherein the coupling of the second load to the drain of the complimentary transistor provides a second leg of the differential logic output a third load substantially equal to the first and second loads; and a second current source operably coupled to the third load, wherein the second current source provides approximately one-half the current as provided by the current source, and wherein the coupling of the third load to the second current source provides the complimentary input signal.

2. The high-speed differential signaling logic gate of claim 1 further comprises:

a NOR function when the first input logic signal corresponds to a positive leg of a first differential input logic signal, the second input logic signal corresponds to a positive leg of a second differential input logic signal, the first leg of the differential logic output is a positive leg of a differential NOR output, and the second leg of the differential logic output is a negative leg of the differential NOR output;

an OR function when the first input logic signal corresponds to the positive leg of the first differential input logic signal, the second input logic signal corresponds to the positive leg of the second differential input logic signal, the first leg of the differential logic output is the negative leg of a differential OR output, and the second leg of the differential logic output is a positive leg of the differential OR output;

a NAND function when the first input logic signal corresponds to a negative leg of the first differential input logic signal, the second input logic signal corresponds to a negative leg of the second differential input logic signal, the first leg of the differential logic output is a negative leg of a differential NAND output, and the second leg of the differential logic output is a positive leg of the differential NAND output; and an AND function when the first input logic signal corresponds to the negative leg of the first differential input logic signal, the second input logic signal corresponds to the negative leg of the second differential input logic signal, the first leg of the differential logic output is a positive leg of a differential AND output, and the second leg of the differential logic output is a negative leg of the differential AND output.

3. The high-speed differential signaling logic gate of claim 1 further comprises:

a third input transistor having a gate, a drain, and a source, wherein the gate of the third input transistor is operably coupled to receive a third input logic signal, and wherein the third input transistor is coupled in parallel to the first and second input transistors.

4. The high-speed differential signaling logic gate of claim 1, wherein the first and second load further comprises resistors having substantially equal resistive values.

5. The high-speed differential signaling logic gate of claim 1, wherein the first, second, and complimentary transistors further comprises at least one of:

N-channel transistors; and

P-channel transistors.

6. A high-speed differential signaling combinational logic circuit comprises:

a first input transistor having a gate, a drain, and a source, wherein the gate of the first input transistor is operably coupled to receive a first input logic signal;

a second input transistor having a gate, a drain, and a source, wherein the gate of the second input transistor is operably coupled to receive a second input logic signal, wherein the first and second input transistors are coupled in parallel;

a complimentary transistor having a gate, a drain, and a source, wherein the source of the complimentary transistor is operably coupled to the sources of the first and second input transistors, wherein the gate of the complimentary transistor is operably coupled to receive a complimentary input signal;

a third input transistor having a gate, a drain, and a source, wherein the gate of the third input transistor is operably coupled to receive a first leg of a third input logic signal, and wherein the drain of the third input transistor is operably coupled to the sources of the first, second, and complimentary transistors;

a fourth input transistor having a gate, a drain, and a source, wherein the gate of the fourth input transistor is operably coupled to receive a second leg of the third input logic signal, and wherein the drain of the fourth input transistor is operably coupled to the drain of the complimentary transistor;

a current source operably coupled to the sources of the third and fourth input transistors and to a first potential;

a first load operably coupled to the drains of the first and second input transistors and to a second potential, wherein the coupling of the first load to the drains of the first and second input transistors provides a first leg of a differential logic output of the high-speed differential signaling combinational logic circuit; and a second load operably coupled to the drain of the complimentary transistor and to the second potential, wherein the coupling of the second load to the drain of the complimentary transistor provides a second leg of the differential logic output.

7. The high-speed differential signaling combinational logic circuit of claim 6 further comprises:

a OR-NAND function when the first input logic signal corresponds to a positive leg of a first differential input logic signal, the second input logic signal corresponds to a positive leg of a second differential input logic signal, the first leg of the differential logic output is a positive leg of a differential OR-NAND output, and the second leg of the differential logic output is a negative leg of the differential OR-NAND output;

an OR-AND function when the first input logic signal corresponds to the positive leg of the first differential input logic signal, the second input logic signal corresponds to the positive leg of the second differential input logic signal, the first leg of the differential logic output is the negative leg of a differential OR-AND output, and the second leg of the differential logic output is a positive leg of the differential OR-AND output; and a NAND-AND function when the first input logic signal corresponds to a negative leg of the first differential input logic signal, the second input logic signal corresponds to a negative leg of the second differential input logic signal, the first leg of the differential logic output is a negative leg of a differential NAND-AND output, and the second leg of the differential logic output is a positive leg of the differential NAND-AND output.

8. The high-speed differential signaling combinational logic circuit of claim 6 further comprises:

third load substantially equal to the first and second loads; and second current source operably coupled to the third load, wherein the second current source provides approximately one-half the current as provided by the current source, and wherein the coupling of the third load to the second current source provides the complimentary input signal.

9. The high-speed differential signaling combinational logic circuit of claim 6 further comprises:
the gate of the complimentary transistor coupled to the drains of the first and second input transistors to provide the complimentary input signal.

10. The high-speed differential signaling combinational logic circuit of claim 6 further comprises:
a fifth input transistor having a gate, a drain, and a source, wherein the gate of the fifth input transistor is operably coupled to receive a fourth input logic signal, and wherein the fifth input transistor is coupled in parallel to the first and second input transistors.

11. The high-speed differential signaling combinational logic circuit of claim 6, wherein the first and second load further comprises resistors having substantially equal resistive values.

12. The high-speed differential signaling combinational logic circuit of claim 6, wherein the first, second, third, fourth, and complimentary transistors further comprises at least one of:
N-channel transistors; and
P-channel transistors.

13. An oscillation synthesizer comprises:
a phase and frequency detector operably coupled to generate a charge up signal when phase of a reference oscillation leads phase of a feedback oscillation or when frequency of the reference oscillation leads frequency of the feedback oscillation, to generate a charge down signal when the phase of the reference oscillation lags the phase of the feedback oscillation or when the frequency of the reference oscillation lags the frequency of the feedback oscillation;
a charge pump operably coupled to produce a positive current in response to the charge up signal and to produce a negative current in response to the charge down signal;
a loop filter operably coupled to generate a control voltage based on the positive current and negative current;
a voltage controlled oscillator operably coupled to generate an output oscillation based on the control voltage; and
a divider module operably coupled to produce the feedback oscillation from the output oscillation based on a divider value, wherein the divider module includes:
a plurality of flip-flops interoperably coupled to produce the feedback oscillation by dividing the output oscillation in accordance with a control signal; and
a logic circuit operable to produce the control signal based on a divider select signal, wherein the logic circuit includes:
a first input transistor having a gate, a drain, and a source, wherein the gate of the first input transistor is operably coupled to receive a first output from the plurality of flip-flops;
a second input transistor having a gate, a drain, and a source, wherein the gate of the second input transistor is operably coupled to receive an input logic signal corresponding to the divider select signal, wherein the first and second input transistors are coupled in parallel;
a complimentary transistor having a gate, a drain, and a source, wherein the source of the complimentary transistor is operably coupled to the sources of the first and second input transistors, wherein the gate of the complimentary transistor is operably coupled to receive a complimentary input signal;
a current source operably coupled to the sources of the first and second input transistors and to a first potential;
a first load operably coupled to the drains of the first and second input transistors and to a second potential, wherein the coupling of the first load to the drains of the first and second input transistors provides a first leg of the control signal;
a second load operably coupled to the drain of the complimentary transistor and to the second potential, wherein the coupling of the second load to the drain of the complimentary transistor provides a second leg of the control signal
third load substantially equal to the first and second loads; and
second current source operably coupled to the third load, wherein the second current source provides approximately one-half the current as provided by the current source, and wherein the coupling of the third load to the second current source provides the complimentary input signal.

14. The oscillation synthesizer of claim 13, wherein the logic circuit further comprises:
a NOR function when the first input logic signal corresponds to a positive leg of a first differential input logic signal, the second input logic signal corresponds to a positive leg of a second differential input logic signal, the first leg of the differential logic output is a positive leg of a differential NOR output, and the second leg of the differential logic output is a negative leg of the differential NOR output;
an OR function when the first input logic signal corresponds to the positive leg of the first differential input logic signal, the second input logic signal corresponds to the positive leg of the second differential input logic signal, the first leg of the differential logic output is the negative leg of a differential OR output, and the second leg of the differential logic output is a positive leg of the differential OR output;
a NAND function when the first input logic signal corresponds to a negative leg of the first differential input logic signal, the second input logic signal corresponds to a negative leg of the second differential input logic signal, the first leg of the differential logic output is a negative leg of a differential NAND output, and the second leg of the differential logic output is a positive leg of the differential NAND output; and
an AND function when the first input logic signal corresponds to the negative leg of the first differential input logic signal, the second input logic signal corresponds to the negative leg of the second differential input logic signal, the first leg of the differential logic output is a positive leg of a differential AND output, and the second leg of the differential logic output is a negative leg of the differential AND output.

15. The oscillation synthesizer of claim 13, wherein the logic circuit further comprises:
a third input transistor having a gate, a drain, and a source, wherein the gate of the third input transistor is operably coupled to receive a third input logic signal, and wherein the third input transistor is coupled in parallel to the first and second input transistors.

16. The oscillation synthesizer of claim 13, wherein the first and second load further comprises resistors having substantially equal resistive values.

17. The oscillation synthesizer of claim 13, wherein the first, second, and complimentary transistors further comprises at least one of:
N-channel transistors; and
P-channel transistors.

18. The oscillation synthesizer of claim 13, wherein the logic circuit further comprises:
a third input transistor having a gate, a drain, and a source, wherein the gate of the third input transistor is operably coupled to receive a first leg of a third input logic signal, and wherein the third input transistor provides part of the operably coupling between the first and second input transistors and the current source; and
a fourth input transistor having a gate, a drain, and a source, wherein the gate of the fourth input transistor is operably coupled to receive a second leg of the third input logic signal, and wherein the fourth transistor provides another part of the operably coupling between the first and second input transistors and the current source.

19. The oscillation synthesizer of claim 13 further comprises:
the divider module providing an integer divider value or a fractional-N divider value.

20. An integrated circuit radio comprises:
a transmitter section operably coupled to convert outbound data into outbound radio frequency (RF) signals based on a transmitter local oscillation;
a receiver section operably coupled to convert inbound RF signals into inbound data based on a receiver local oscillation;
a local oscillation module operably coupled to produce the transmitter and receiver local oscillations, wherein the local oscillation module includes:
a phase and frequency detector operably coupled to generate a charge up signal when phase of a reference oscillation leads phase of a feedback oscillation or when frequency of the reference oscillation leads frequency of the feedback oscillation, to generate a charge down signal when the phase of the reference oscillation lags the phase of the feedback oscillation or when the frequency of the reference oscillation lags the frequency of the feedback oscillation;
a charge pump operably coupled to produce a positive current in response to the charge up signal and to produce a negative current in response to the charge down signal;
a loop filter operably coupled to generate a control voltage based on the positive current and negative current;
a voltage controlled oscillator operably coupled to generate an output oscillation based on the control voltage, wherein the transmitter and receiver local oscillations are based on the output oscillation; and
a divider module operably coupled to produce the feedback oscillation from the output oscillation based on a divider value, wherein the divider module includes:
a plurality of flip-flops interoperably coupled to produce the feedback oscillation by dividing the output oscillation in accordance with a control signal; and a logic circuit operable to produce the control signal based on a divider select signal, wherein the logic circuit includes:
a first input transistor having a gate, a drain, and a source, wherein the gate of the first input transistor is operably coupled to receive a first output from the plurality of flip-flops;
a second input transistor having a gate, a drain, and a source, wherein the gate of the second input transistor is operably coupled to receive an input logic signal corresponding to the divider select signal, wherein the first and second input transistors are coupled in parallel;
a complimentary transistor having a gate, a drain, and a source, wherein the source of the complimentary transistor is operably coupled to the sources of the first and second input transistors, wherein the gate of the complimentary transistor is operably coupled to receive a complimentary input signal;
a current source operably coupled to the sources of the first and second input transistors and to a first potential;
a first load operably coupled to the drains of the first and second input transistors and to a second potential, wherein the coupling of the first load to the drains of the first and second input transistors provides a first leg of the control signal;
a second load operably coupled to the drain of the complimentary transistor and to the second potential, wherein the coupling of the second load to the drain of the complimentary transistor provides a second leg of the control signal
third load substantially equal to the first and second loads; and
second current source operably coupled to the third load, wherein the second current source provides approximately one-half the current as provided by the current source, and wherein the coupling of the third load to the second current source provides the complimentary input signal.

21. The integrated circuit radio of claim 20, wherein the logic circuit further comprises:
a NOR function when the first input logic signal corresponds to a positive leg of a first differential input logic signal, the second input logic signal corresponds to a positive leg of a second differential input logic signal, the first leg of the differential logic output is a positive leg of a differential NOR output, and the second leg of the differential logic output is a negative leg of the differential NOR output;
an OR function when the first input logic signal corresponds to the positive leg of the first differential input logic signal, the second input logic signal corresponds to the positive leg of the second differential input logic signal, the first leg of the differential logic output is the negative leg of a differential OR output, and the second leg of the differential logic output is a positive leg of the differential OR output;
a NAND function when the first input logic signal corresponds to a negative leg of the first differential input logic signal, the second input logic signal corresponds to a negative leg of the second differential input logic signal, the first leg of the differential logic output is a negative leg of a differential NAND output, and the second leg of the differential logic output is a positive leg of the differential NAND output; and an AND function when the first input logic signal corresponds to the negative leg of the first differential input logic signal, the second input logic signal corresponds to the negative leg of the second differential input logic signal, the first leg of the differential logic output is a positive leg of a differential AND output, and the second leg of the differential logic output is a negative leg of the differential AND output.

22. The integrated circuit radio of claim 20, wherein the logic circuit further comprises:

a third input transistor having a gate, a drain, and a source, wherein the gate of the third input transistor is operably coupled to receive a third input logic signal, and wherein the third input transistor is coupled in parallel to the first and second input transistors.

23. The integrated circuit radio of claim 20, wherein the first and second load further comprises resistors having substantially equal resistive values.

24. The integrated circuit radio of claim 20, wherein the first, second, and complimentary transistors further comprises at least one of:

N-channel transistors; and
P-channel transistors.

25. The integrated circuit radio of claim 20, wherein the logic circuit further comprises:

a third input transistor having a gate, a drain, and a source, wherein the gate of the third input transistor is operably coupled to receive a first leg of a third input logic signal, and wherein the third input transistor provides part of the operably coupling between the first and second input transistors and the current source; and a fourth input transistor having a gate, a drain, and a source, wherein the gate of the fourth input transistor is operably coupled to receive a second leg of the third input logic signal, and wherein the fourth transistor provides another part of the operably coupling between the first and second input transistors and the current source.

26. The integrated circuit radio of claim 20 further comprises:

the divider module providing an integer divider value or a fractional-N divider value.

* * * * *